United States Patent
Tanida et al.

(10) Patent No.: US 9,368,426 B2
(45) Date of Patent: Jun. 14, 2016

(54) PIEZOELECTRIC FAN AND AIR COOLING APPARATUS USING THE PIEZOELECTRIC FAN

(75) Inventors: Masayoshi Tanida, Nagaokakyo (JP); Midori Sunaga, Nagaokakyo (JP); Hiroaki Wada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 846 days.

(21) Appl. No.: 13/370,341

(22) Filed: Feb. 10, 2012

(65) Prior Publication Data
US 2013/0037245 A1 Feb. 14, 2013

Related U.S. Application Data

(63) Continuation of application No. PCT/JP2010/064438, filed on Aug. 26, 2010.

(30) Foreign Application Priority Data

Sep. 1, 2009 (JP) .................................. 2009-201239

(51) Int. Cl.
H01L 23/467 (2006.01)
F04D 33/00 (2006.01)
H05K 7/20 (2006.01)

(52) U.S. Cl.
CPC .............. *H01L 23/467* (2013.01); *F04D 33/00* (2013.01); *H05K 7/20172* (2013.01); *H01L 2924/0002* (2013.01); *H01L 2924/3011* (2013.01)

(58) Field of Classification Search
CPC .............................. H01L 23/467; F04D 33/00
USPC ...................... 165/80.3, 121, 109.1
See application file for complete search history.

(56) References Cited

U.S. PATENT DOCUMENTS 5,008,582 A * 4/1991 Tanuma et al. ............... 310/332
5,127,387 A * 7/1992 Matsuo ......................... 123/617

(Continued)

FOREIGN PATENT DOCUMENTS

JP 62-82399 U 5/1987
JP 62-149158 A 7/1987

(Continued)

OTHER PUBLICATIONS www of pc.watch.impress.co.jp/docs/2007/0423/intel.htm Oct. 10, 2007 (via Wayback Machine).*
translation of www of pc.watch.impress.co.jp/docs/2007/0423/intel.htm Oct. 10, 2007 (via Wayback Machine).*
Official Communication issued in International Patent Application No. PCT/JP2010/064438, mailed on Sep. 28, 2010.

*Primary Examiner* — M. Alexandra Elve
*Assistant Examiner* — Joel Attey
(74) *Attorney, Agent, or Firm* — Keating & Bennett, LLP

(57) ABSTRACT

A piezoelectric fan includes a vibration plate one end of which in a length direction is supported in a fixed manner and the other end of which in the length direction is a free end; and piezoelectric elements, attached on at least one of front and back surfaces of the vibration plate. In an intermediate portion of the vibration plate in the length direction, a right-angle bent portion is provided, and a plurality of divided blades are defined by slits in an area of the vibration plate extending from the free end to a position located a predetermined distance from the bent portion toward the free end. The piezoelectric element is attached on the portion of the vibration plate between the fixed end and the bent portion. Hence, variations in resonant frequency among the blades are reduced and the blades are efficiently excited using a common piezoelectric element.

6 Claims, 6 Drawing Sheets

(56) References Cited

U.S. PATENT DOCUMENTS

| | | | |
|---|---|---|---|
| 7,005,776 B1* | 2/2006 | Iino et al. | 310/316.01 |
| 7,057,267 B2* | 6/2006 | Urushido | 257/666 |
| 7,321,184 B2* | 1/2008 | Lee et al. | 310/341 |
| 2004/0190305 A1* | 9/2004 | Arik et al. | 362/555 |
| 2007/0037506 A1* | 2/2007 | Lee et al. | 454/184 |
| 2008/0238256 A1* | 10/2008 | Leija et al. | 310/328 |
| 2009/0004034 A1* | 1/2009 | Lee | 417/410.2 |
| 2009/0085438 A1* | 4/2009 | Chrysler et al. | 310/328 |
| 2009/0230819 A1* | 9/2009 | Sauciuc | 310/328 |
| 2009/0243431 A1* | 10/2009 | Ohsawa | 310/317 |

FOREIGN PATENT DOCUMENTS

| | | |
|---|---|---|
| JP | 64-057000 A | 3/1989 |
| JP | 02-019700 A | 1/1990 |
| JP | 2-127796 U | 10/1990 |
| JP | 2008-297915 A | 12/2008 |
| JP | 2010-067909 A | 3/2010 |

\* cited by examiner

MAGNITUDE OF PIEZOELECTRIC VIBRATION

PIEZOELECTRIC FAN AND AIR COOLING APPARATUS USING THE PIEZOELECTRIC FAN

BACKGROUND OF THE INVENTION

1. Field of the Invention

The present invention relates to piezoelectric fans and air cooling apparatuses that vibrate blades by driving piezoelectric elements, thereby exhausting warm air from a heat source such as a heat sink.

2. Description of the Related Art

In recent years, because of a reduction in size and increasing component mounting density, portable electronic apparatuses have a problem with exhausting heat that is generated within the electronic apparatuses. In order to efficiently cool such electronic apparatuses by air cooling, air cooling apparatuses called piezoelectric fans have been proposed. In a piezoelectric fan using a piezoelectric element, as illustrated in FIG. 5, piezoelectric elements 22 are pasted on both surfaces of a planar metal plate 21 at one end, thereby forming a bimorph actuator portion 23 in the portion where the piezoelectric elements 22 have been pasted, one end of the actuator portion 23 is supported by a support member 24, and a plurality of comb-shaped blades 21a are formed on the other end of the metal plate 21. By inserting the blades 21a between fins 31, and driving the piezoelectric element 22, the blades 21a are excited, whereby warm air between the fins 31 is efficiently exhausted.

In a piezoelectric fan having this structure, since the blades 21a extend straight from the actuator portion, there is a problem in that the actuator portion 23 protrudes considerably outside of a heat sink 30, whereby the occupied volume becomes large. The blades 21a are displaced considerably as a result of the vibration of the piezoelectric element 22 being transmitted to the blades 21a. On the other hand, since the amplitude of the blades 21a is large, the piezoelectric element 22 also vibrates considerably due to the reaction. As a result, the load on the piezoelectric element increases and, hence, reliability may decrease due to, for example, generation of cracks in the piezoelectric element.

Japanese Unexamined Utility Model Registration Application Publication No. 02-127796 discloses a small fan in which one end of a piezoelectric element is fixed to a support member and a blade is attached to the other end of the piezoelectric element in a direction perpendicular to the extension direction of the piezoelectric element. In this case, lengths in the longitudinal and width directions can be reduced and, hence, there is an advantage in that the occupied space is reduced. However, this type of a fan has a structure in which a separately prepared blade is attached to the piezoelectric element using a connection member and, hence, stress is concentrated in the connection member portion. As a result, an excitation effect with long-term stability is not realized. In addition, since a structure is employed in which a single blade is attached to a single piezoelectric element, blades cannot be inserted between the plurality of fins of a heat sink and, hence, warm air between the fins cannot be efficiently exhausted.

SUMMARY OF THE INVENTION

Preferred embodiments of the present invention provide a piezoelectric fan and an air cooling apparatus with a strong cooling effect and durability in which variations in amplitude among a plurality of blades are prevented when the blades are excited using a common piezoelectric element.

Before describing various preferred embodiments of the present invention, description will be made regarding the background of how preferred embodiments of the present invention came to be completed. FIG. 6 illustrates an example of a piezoelectric fan. In this piezoelectric fan 20, piezoelectric elements 22 are pasted on both surfaces of a vibration plate 21 at one end thereof, and a plurality of blades 21a are integrally formed at the other end of the vibration plate 21, where the blades 21a are bent by 90 degrees near the bases of the blades 21a. The one end of the vibration plate 21 is fixed by a support member 24. In the case of this structure, as illustrated in FIG. 7, the blades 21a can be inserted between fins 31 in the vertical direction and, hence, the center of the bottom surface of a heat sink 30 can be intensively cooled. In addition, since the actuator portion can be arranged along the exterior of the heat sink 30, space can be saved. Further, as described later, the effect of the vibration of the blades 21a on the piezoelectric element 22 is reduced compared with a straight-line fan and, hence, the reliability of the piezoelectric element 22 is considered to be increased.

FIG. 8 is a diagram illustrating piezoelectric element displacement versus blade bending angle for voltages of 30 Vpp and 60 Vpp applied to the piezoelectric element. Note that the vibration plate is a stainless steel plate with a thickness of 0.1 mm, the blade width is 4 mm, the length L1 between the bent portion of the blade and the tip is 22 mm, and the length L2 between the bent portion and the support member is 20 mm. As can be seen from FIG. 8, the displacement of the piezoelectric element decreases as the blade bending angle increases, compared with the case of straight line blades (angle of 0°). For example, the displacement of the piezoelectric element for a blade bending angle of 90° is 60% of that in the case of straight-line blades. This shows that the load on the piezoelectric element can be reduced by bending the blades.

FIG. 9 is a diagram illustrating displacement ratio versus blade bending angle for voltages of 30 Vpp and 60 Vpp applied to the piezoelectric element. The displacement ratio is a ratio of the displacement of the blade tips to the displacement of the piezoelectric element, and the larger the displacement ratio, the better the excitation efficiency. The displacement ratio is about 24 when the blades are straight (angle of 0°), whereas the displacement ratio increases to about 35 when the blade bending angle is 90°. In other words, the tip portions of the blades can be more efficiently excited when the blades are bent.

Although a piezoelectric fan with bent blades is advantageous as described above, the following problem arises. That is, since the blades 21a are bent halfway, variations in resonant frequency among the blades 21a increase, whereby variations in amplitude among the tip portions of the blades increase. When the piezoelectric element 22 is driven, as illustrated in FIG. 6, the base portions (before being bent) of the blades 21a vibrate in a direction A and the tip portions of the blades 21a vibrate in a direction B, which is perpendicular to the direction A. Although the blades 21a are designed in advance to have the same resonant frequency, the resonant frequencies of the blades 21a are actually different from one another due to minute difference in bending angle or radius among the bent portions. However, since the piezoelectric element 22 is driven at a fixed frequency, variations in amplitude among the blades 21a are generated. Hence, there is a problem in that variations in cooling effect among the fins are generated.

In view of the above circumstances, a preferred embodiment of the present invention provides a piezoelectric fan including a vibration plate one end of which in a length direction is supported in a fixed manner and the other end of which in the length direction is a free end; and a piezoelectric element attached on at least one of front and back surfaces of the vibration plate, wherein an air stream is generated by vibrating the vibration plate in the thickness direction thereof through driving of the piezoelectric element, wherein, in an intermediate portion of the vibration plate in a length direction thereof, a right-angle bent portion is provided, wherein a plurality of divided blades are defined by slits in an area of the vibration plate from the free end to a position that is located a predetermined distance from the bent portion toward the free end, and the piezoelectric element is attached on the portion of the vibration plate between the fixed end and the bent portion.

Preferred embodiments of the present invention were developed based on the findings that variations in amplitude among the blades are prevented and suppressed and a piezoelectric fan with advantageous cooling effect and durability can be realized when the blades are vibrated in a state in which the resonant frequencies have been made to be uniform by combining the blades rather than when the individual blades are vibrated considerably. When bent portions are formed in the blade portions as illustrated in FIG. 6, large amplitudes are realized at the tip portions of the blades. However, when the piezoelectric element is driven at a frequency tuned to the resonant frequency of a blade having the largest amplitude, some blades have small amplitudes due to variations in resonant frequencies. In addition, stress is concentrated in the bent portions and, hence, the bent portions are likely to break. On the other hand, in various preferred embodiments of the present invention, a right-angle bent portion is preferably formed in a stage prior to division into a plurality of blades. Hence, although the maximum amplitude of the blades is slightly reduced, variations in the angles or radiuses of the bent portions are reduced, whereby variations in resonant frequency among the blades are reduced. In other words, although the maximum amplitude becomes smaller than when the bent portions are formed in the blade portions, the minimum amplitude is increased. As a result, the amplitudes of all the blades can be made to be approximately uniform and uniform cooling effects are obtained. Further, since the cross-sectional area of the bent portion is increased, stress concentration in the bent portion is reduced, whereby reliability against fatigue failure in the bent portion is increased.

A right angle or perpendicular direction in the present invention need not exactly be 90°, and a range of about 90°±10°, for example, allows similar effects to be obtained. The vibration plate may be a resin plate, and is not limited to a metal plate such as a stainless steel plate. The piezoelectric element may preferably be attached on one or both of the vibration plate surfaces. A unimorph actuator is provided in the case of a single surface and a bimorph actuator is provided in the case of both surfaces. The thickness of the vibration plate (blade), Young's modulus, the length of the blade, and the like may be appropriately set so as to allow the blades to resonate in the primary mode when driven by the piezoelectric element.

The bent portion may include a round surface. Although the bent portion may include a square edge, fatigue failure due to process distortion is likely to occur. On the other hand, when a round surface is included in the bent portion, distortion in processing is alleviated and occurrence of fatigue failure is prevented and suppressed.

It is preferable to provide a structure in which an extension portion to which a piezoelectric element is not attached is provided at the one end of the vibration plate in the length direction, and the extension portion is supported in a fixed manner by a support member. Although the end portion of the piezoelectric element may be supported in a fixed manner, the support member prevents and suppresses the displacement of the piezoelectric element in that case and, hence, conversion efficiency from electric energy to vibration energy is decreased. On the other hand, when the extension portion of the vibration plate is supported in a fixed manner, it becomes easy to displace the piezoelectric element freely, whereby the conversion efficiency is increased.

It is preferable to provide a driver circuit that keeps the blades in a resonant state by sweeping a frequency of a signal supplied to the piezoelectric element over a predetermined range, automatically detecting a resonant frequency of the blades on the basis of a change in impedance in the sweeping, and driving the piezoelectric element at the resonant frequency. A known example of a driver circuit to drive the piezoelectric element excites the blades by applying a signal having a predetermined frequency. However, such a driver circuit cannot excite the blades efficiently when there is a difference between the frequency of the signal and the resonant frequency of the blades. Hence, a driver circuit may be used which keeps the blades in a resonant state by sweeping a frequency of a signal supplied to the piezoelectric element over a predetermined range, automatically detecting a resonant frequency of the blades, and driving the piezoelectric element at the resonant frequency. In this case, when variations in resonant frequency among individual blades are large as in the virtual example, the driver circuit may not operate normally since the driver circuit may detect a plurality of frequencies. In addition, a beat may be generated in the command signal of the driver circuit. In the piezoelectric fan of various preferred embodiments of the present invention, since the vibration plate preferably is bent at a position before a position where the vibration plate is divided into a plurality of blades, variations in resonant frequency among the blades are small, and the automatic-detection driver circuit can detect a proper frequency. Hence, the blades can be efficiently excited at an optimal frequency.

When the piezoelectric fan is applied to a heat sink having a plurality of heat dissipation fins arranged side by side with spaces therebetween, an air cooling apparatus can be realized. In other words, the plurality of the blades of the piezoelectric fan are inserted between the heat dissipation fins such that an excitation direction of the blades is parallel or substantially parallel with side surfaces of the heat dissipation fins. Thereby, air between the heat dissipation fins is efficiently exhausted and a small air cooling apparatus is realized since the amount of protrusion of the piezoelectric fan from the heat sink is reduced.

In the air cooling apparatus described above, it is preferable that the plurality of the blades of the piezoelectric fan be inserted in a direction perpendicular or substantially perpendicular to a bottom surface of the heat sink, and the piezoelectric element be arranged in parallel or substantially in parallel with top surfaces of the fins of the heat sink. In this case, the center of the bottom surface of the heat sink can be intensively cooled and the piezoelectric element can be arranged along the upper portion of the heat sink, resulting in space saving.

As has been described above, according to various preferred embodiments of the present invention, since a bent portion is formed at a position before a position at which a plurality of the blades have been formed, variations in resonant frequency among the blades can be reduced. Hence, the amplitudes of all the blades can be made to be approximately uniform, and uniform cooling effects are obtained. Further, since the cross-sectional area of the bent portion is increased, stress concentration in the bent portion is reduced, whereby reliability against fatigue failure in the bent portion is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention are described with reference to the drawings.

Figure 1:
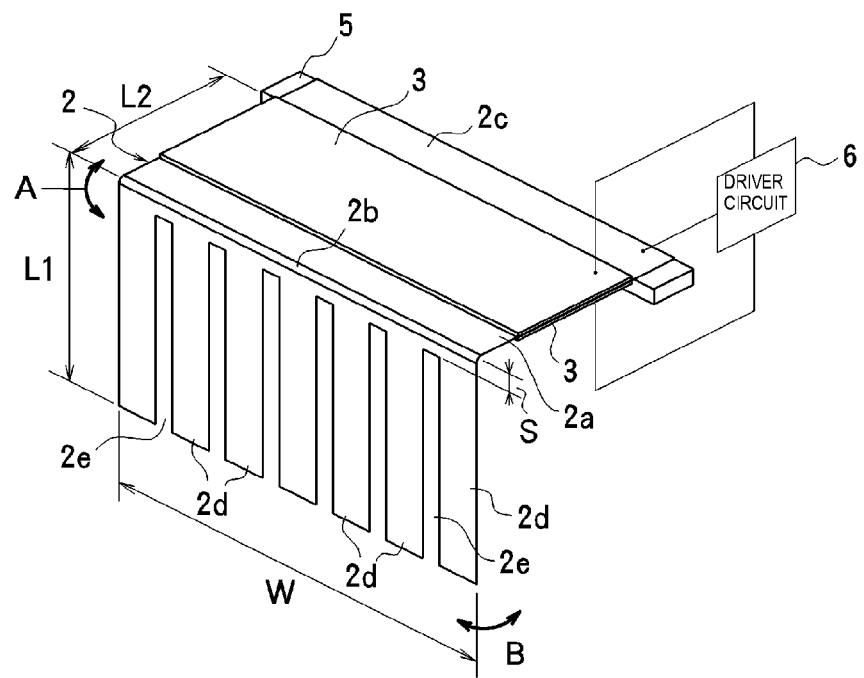
FIG. 1 is a perspective view of a first preferred embodiment of a piezoelectric fan according to the present invention.
Figure 2:
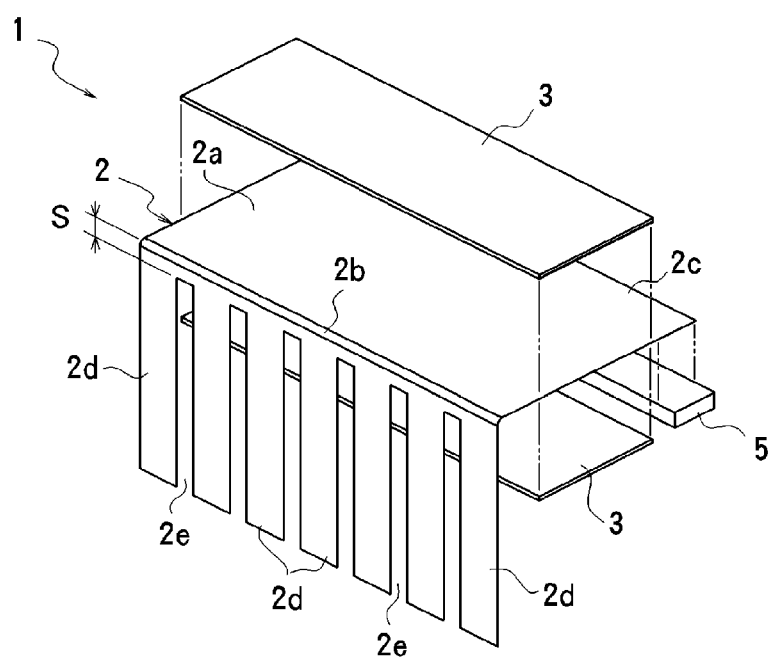
FIG. 2 is an exploded perspective view of the piezoelectric fan illustrated in FIG. 1.

FIG. 1 and FIG. 2 illustrate a first preferred embodiment of a piezoelectric fan according to the present invention. This piezoelectric fan 1 includes a vibration plate 2 that preferably is a thin metal plate, such as a stainless plate, for example. A planar substrate portion 2a is provided on one end (fixed end) side of the vibration plate 2 in the length direction, and piezoelectric elements 3 and 3 are attached on the front and back surfaces of the substrate portion 2a, whereby a bimorph actuator is provided. Note that by attaching the piezoelectric element 3 on one surface of the substrate portion 2a, a unimorph actuator may be provided. The other end (free end) side of the vibration plate 2 in the length direction includes a plurality (for example, seven in this case) of blades 2d integrally provided thereon by forming a plurality of parallel slits 2e. A 90° bent portion 2b is provided in the intermediate portion of the vibration plate 2 in the length direction, and the slits 2e are preferably located in an area of the vibration plate 2 extending from the free end to a position which is a predetermined length S from the bent portion 2b toward the free end. Hence, the blades 2d are divided into a plurality on the other end side of the bent portion 2b in the length direction. In other words, the vibration plate 2 is bent at a position before a position where the vibration plate 2 is divided into the blades 2d. The bent portion 2b in this preferred embodiment preferably includes a round surface. The blades 2d extend in a direction perpendicular or substantially perpendicular to the main surface direction of the piezoelectric element 3. An extension portion 2c where the piezoelectric element 3 is not attached is provided on the terminating end side of the substrate portion 2a of the vibration plate 2, i.e., in an end portion of the substrate portion 2a opposite the bent portion 2b, and the extension portion 2c is supported by a support member 5 fixed to a fixed portion (not illustrated). The two piezoelectric elements 3 and 3 and the vibration plate 2 are electrically connected to a driver circuit 6.

When frequency signals having opposite phases are supplied to the two piezoelectric elements 3 and 3 from the driver circuit 6, bending vibration in the up-down direction is generated in the actuator portion and vibration in a direction A is generated in the bent portion 2b. Hence, large-amplitude vibration in a direction B perpendicular to the direction A is excited in the tip portions of the blades 2d. The driver circuit 6 in the present preferred embodiment has a function of sweeping the frequencies of the signals supplied to the piezoelectric elements 3 and 3 over a specified range, automatically detecting the resonant frequency of the blades 2d from a change in impedance in the sweeping, and driving the piezoelectric elements 3 and 3 using that resonant frequency, thereby keeping the blades 2d in a resonant state. Since the driver circuit 6 is publicly known from, for example, Japanese Unexamined Patent Application Publication No. 64-57000, the detailed description thereof is omitted. Since the seven blades 2d are divided at a position a distance from the bent portion 2b toward the tip, variations in resonant frequency among the blades 2d are small, as will be described below, and the resonant frequency of the blades 2d can be accurately detected by the driver circuit 6. Hence, all the blades 2d can be efficiently excited.

Figure 3:
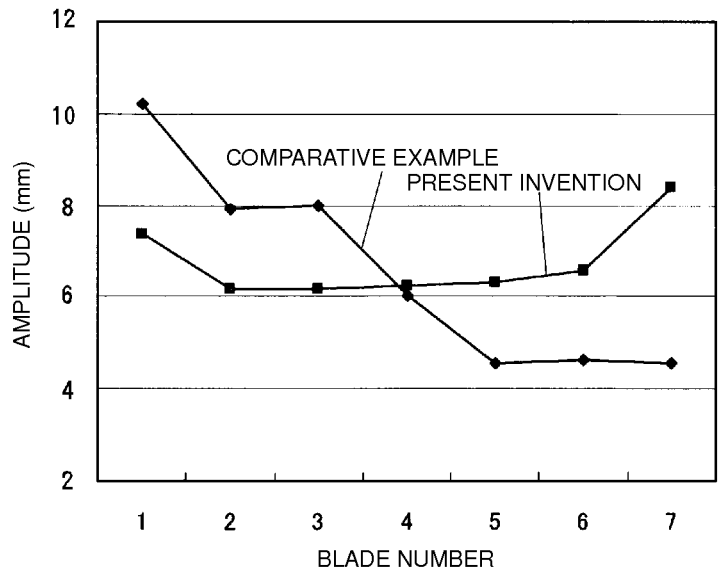
FIG. 3 illustrates a comparison of the amplitudes of the blade tip portions of piezoelectric fans between a first comparative example and a preferred embodiment of the present invention.
Figure 6:
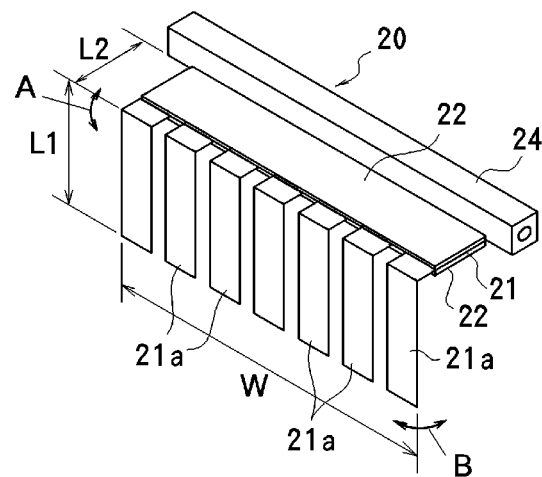
FIG. 6 is a perspective view of a first comparative example in which a conventional structure has been applied to Japanese Unexamined Utility Model Registration Application Publication No. 02-127796.
Figure 7:
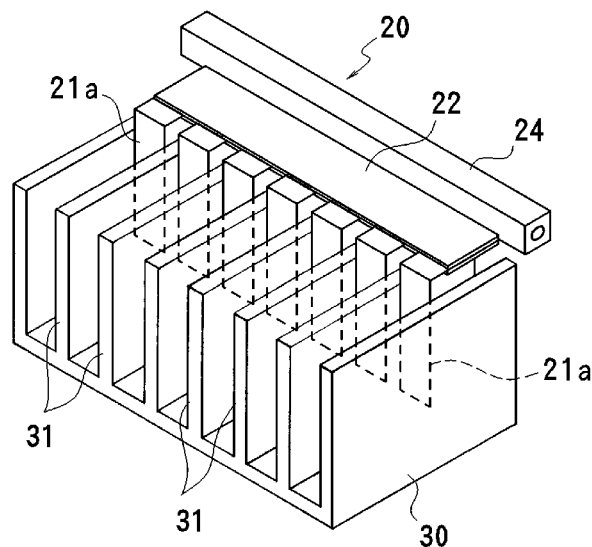
FIG. 7 is a perspective view of an example in which the piezoelectric fan illustrated in FIG. 6 has been applied to an air cooling apparatus for a heat sink.
Figure 8:
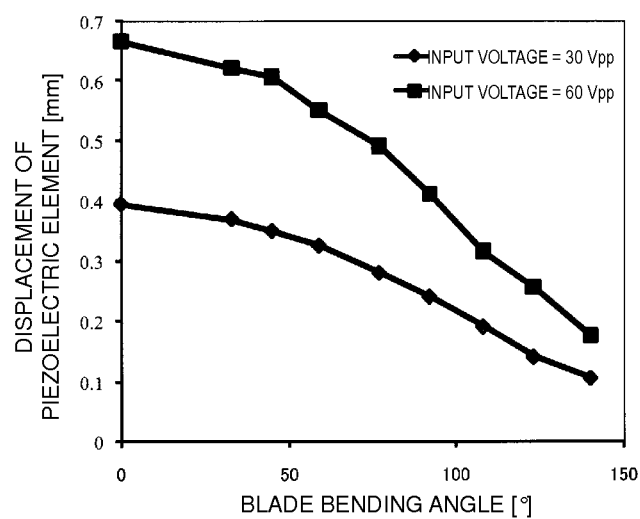
FIG. 8 is a diagram illustrating piezoelectric element displacement versus blade bending angle for the cases in which voltages of 30 Vpp and 60 Vpp are applied to a piezoelectric element.
Figure 9:
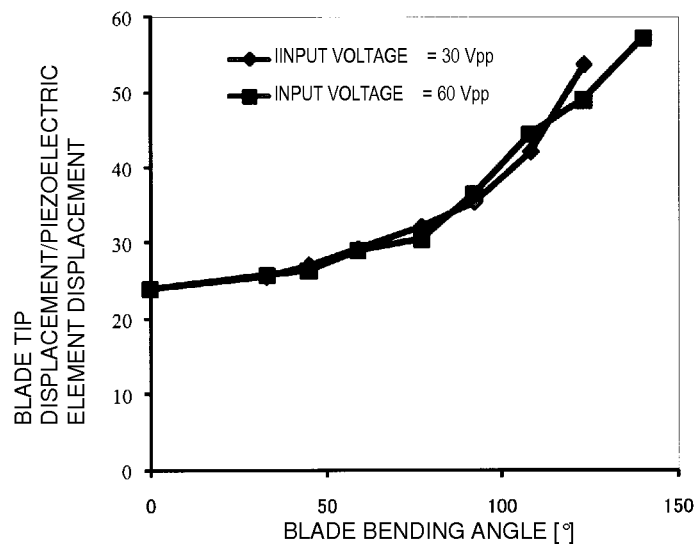
FIG. 9 is a diagram illustrating displacement ratio versus blade bending angle for the cases in which voltages of 30 Vpp and 60 Vpp are applied to a piezoelectric element.

FIG. 3 illustrates a comparison of the amplitudes of the blade tip portions of the piezoelectric fans between a first comparative example (refer to FIG. 6) in which the vibration plate is bent by 90 degrees at a position behind a position where the vibration plate is divided into the seven blades and a non-limiting example of a preferred embodiment of the present invention (refer to FIG. 1) in which the vibration plate is bent by 90 degrees at a position before a position where the vibration plate is divided into the seven blades. The conditions of the vibration plates and blades are as follows.

Vibration plate: a stainless steel plate with a thickness of 0.1 mm
Blade width: 4 mm
Length L1 between the bent portion of the blade and the tip: 22 mm
Length L2 between the bent portion and the support member: 20 mm
Length S between the bent portion and the slit: 2 mm
Slit width: 2 mm
Vibration plate length: 42 mm
Total width of all the blades W: 45 mm
Voltage applied to the piezoelectric element: 30 Vpp, frequency: 145 kHz As is clear from FIG. 3, in the piezoelectric fan of the first comparative example (refer to FIG. 6), which corresponds to the case in which the signal is set so as to make the first blade at one end vibrate with the maximum amplitude (11 mm), the amplitudes of the fifth to seventh blades at the other end decrease to about 8 mm. In other words, the difference between the maximum amplitude and the minimum amplitude is 3 mm and, hence, an amplitude variation of 30% is generated. FIG. 3 corresponds to the case in which the signal supplied to the piezoelectric element is tuned to the resonant frequency of the first blade. However, similar results are obtained irrespective of which one of the resonant frequencies of the blades is chosen to be a frequency to which the signal is tuned.

On the other hand, in the piezoelectric fan according to the non-limiting example of a preferred embodiment of the present invention (refer to FIG. 1), which corresponds to the case in which the signal supplied to the piezoelectric element is set so as to make the seventh blade vibrate with the maximum amplitude (about 10.2 mm, for example), the amplitudes of the blades at the two ends (first and seventh blades) have large amplitudes, but the intermediate blades (second to sixth blades) have about the same amplitude, where the difference between the maximum amplitude and the minimum amplitude is about 1 mm, for example. In other words, the variation in the amplitudes is only about 10%, resulting in small variation in the resonant frequencies of all the blades 2d. Hence, when this piezoelectric fan is used to cool a heat sink, almost uniform cooling effects are realized. When the driver circuit 6, which automatically detects the resonant frequency of the blades 2d, is used in the piezoelectric fan 1 according to the non-limiting example of a preferred embodiment of the present invention, the resonant frequency is properly detected, whereby all the blades 2d can be efficiently excited. Further, since the vibration plate is bent by 90 degrees at a position before a position where the vibration plate is divided into the blades, a sectional area in the bent portion is larger than that of the first comparative example, whereby reliability against fatigue failure in the bent portion is increased.

Figure 4:
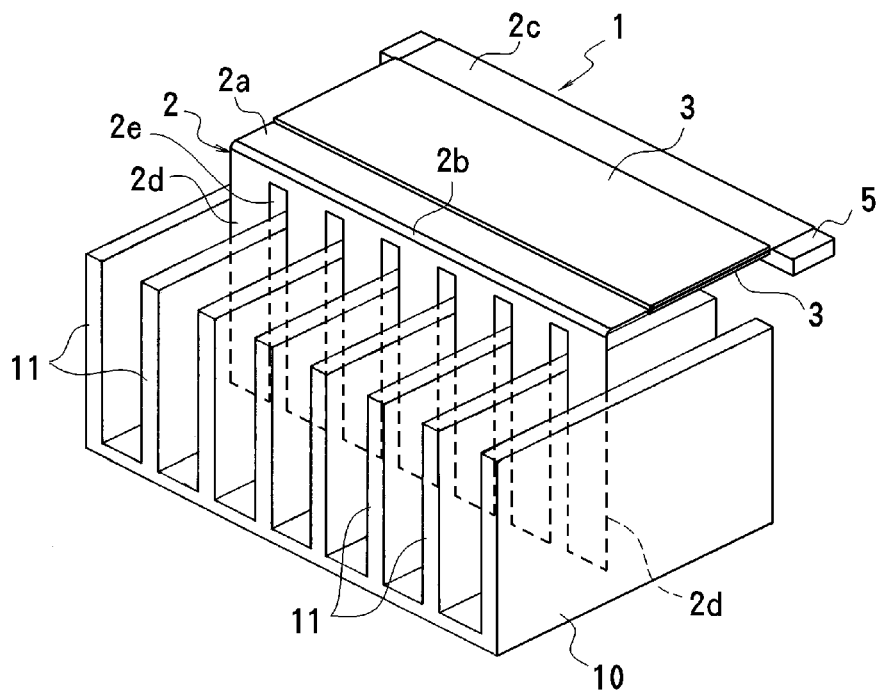
FIG. 4 is a perspective view of an example in which the piezoelectric fan illustrated in FIG. 1 is used as an air cooling apparatus for a heat sink.
Figure 5:
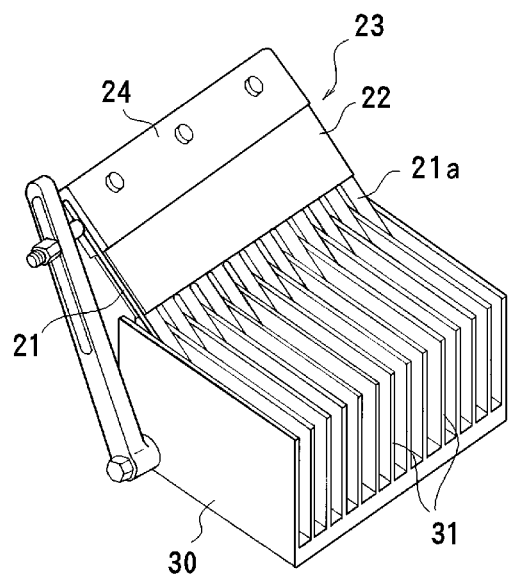
FIG. 5 is a perspective view of a conventional piezoelectric fan.

FIG. 4 illustrates an example in which the piezoelectric fan 1 is used as an air cooling apparatus for a heat sink 10. The heat sink 10 includes a plurality (for example, eight in this case) of heat dissipation fins 11 arranged in parallel or substantially in parallel with one another with spaces therebetween. The heat sink 10 is attached in a thermally coupled state to the upper surface of a heat generating device (such as a CPU), which is, for example, mounted on a circuit substrate. Hence, heat generated from the heat generating device is conducted to the heat sink 10, and air between the heat dissipation fins 11 is heated. The blades 2d of the piezoelectric fan 1 are inserted between the heat dissipation fins 11 in a non-contact state in a direction perpendicular or substantially perpendicular to the bottom surface of the heat sink 10. Since the width of each slit 2e is larger than the thickness of each heat dissipation fin 11, the blades 2d do not come into contact with the heat dissipation fins 11. The actuator portion including the substrate portion 2a of the vibration plate 2 and the piezoelectric element 3 is arranged in parallel or substantially in parallel with and along the upper end of the heat sink 10. Hence, the actuator portion does not protrude considerably outside of the heat sink 10, resulting in space saving. As described before, by driving the piezoelectric elements 3 and 3, the blades 2d are made to vibrate in parallel or substantially in parallel with the sides of the heat dissipation fins 11, thereby removing warm air in the vicinity of the heat dissipation fins 11. As a result, the heat sink 10 can be efficiently cooled.

Figure 10:
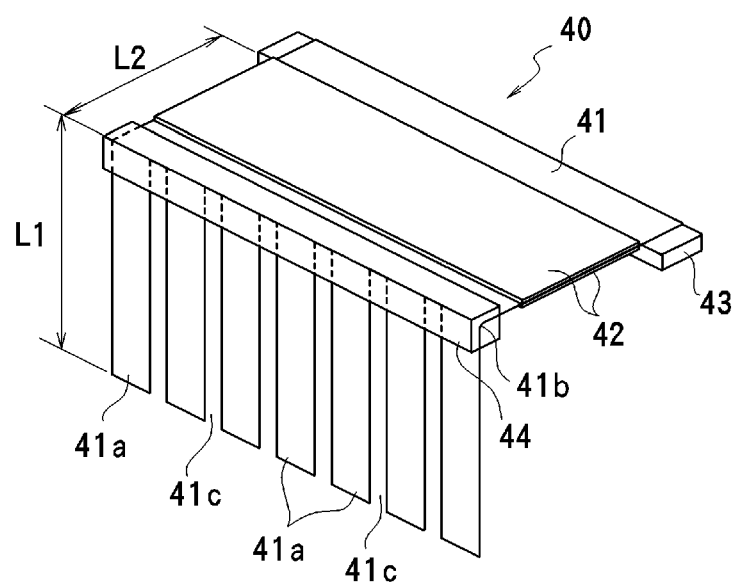
FIG. 10 is a perspective view of a second comparative example to which Japanese Unexamined Patent Application Publication No. 2010-67909 has been applied.

FIG. 10 illustrates a second comparative example for the present invention. In the second comparative example, a total of seven blades are formed by applying the piezoelectric fan illustrated in FIG. 10 of Japanese Unexamined Patent Application Publication No. 2010-67909. Reference numerals 40, 41, 42, and 43 respectively refer to a piezoelectric fan, a vibration plate, a piezoelectric element, and a support member. The vibration plate 41 is divided into a plurality of blades 41a by forming slits 41c in an area of the vibration plate 41 extending from a right-angle bent portion 41b to free ends. A support block 44 is fixed to the inner side and outer side of the bent portion 41b, whereby the bent portion 41b is reinforced.

To compare the characteristics of the non-limiting example of a preferred embodiment of the present invention (refer to FIG. 1) and the second comparative example, the vibration characteristics were measured. The conditions of the vibration plate and blades are as follows.

Vibration plate: a stainless steel plate with a thickness of 0.05 mm

Blade width: 4 mm

Length L1 between the bent portion of the blade and the tip: 26 mm

Length L2 between the bent portion and the support member: 25 mm

Slit width: 2 mm

Support block: 4 mm×4 mm×55 mm stainless steel member

Voltage applied to the piezoelectric element: 20 Vpp, frequency: 45 kHz

Figure 11:
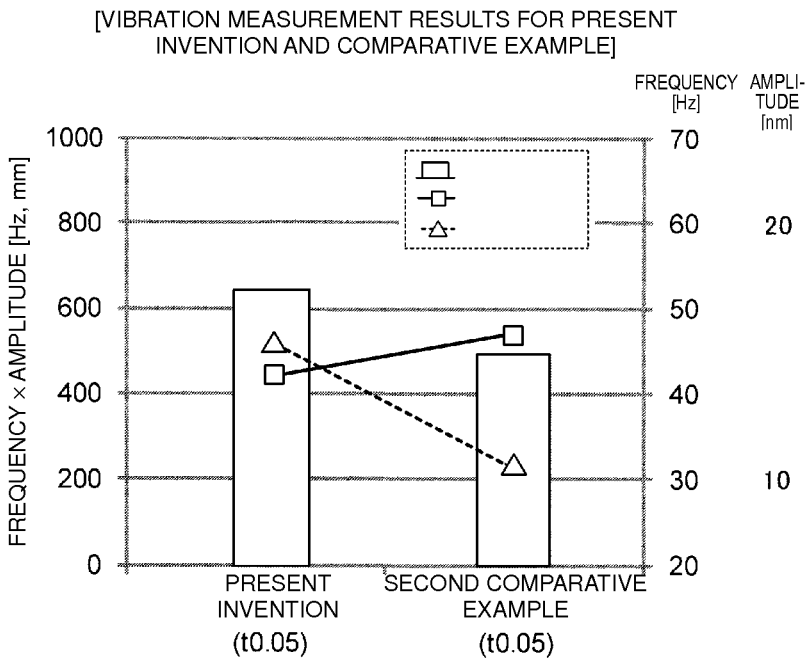
FIG. 11 illustrates the values of frequency×amplitude, indicating the cooling capacities of preferred embodiments of the present invention and the second comparative example.

FIG. 11 illustrates the values of (frequency×blade amplitude), which is an index indicating cooling capacity. In the second comparative example, the vibration state is different from the non-limiting example of a preferred embodiment of the present invention as a result of the support block 44 being added to the bent portion, and the driving frequency becomes higher but the blade amplitude becomes smaller. The reason for this is that since the support block functions as a weight, the mass (inertia) increases, whereby higher energy is required for vibration. In the non-limiting example of a preferred embodiment of the present invention, compared with the second comparative example, the drive frequency is slightly lower, but the average amplitude of the blades is larger and, hence, the frequency×amplitude value is higher than that of the second comparative example. Consequently, it can be seen that the piezoelectric fan of the non-limiting example of a preferred embodiment of the present invention has a higher cooling capacity than the second comparative example.

Figure 12:
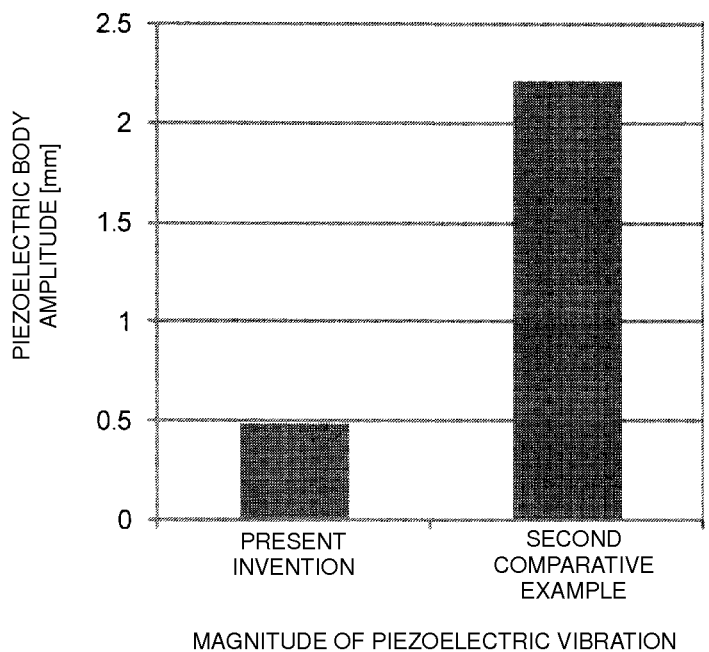
FIG. 12 illustrates a comparison of the vibration magnitudes of piezoelectric bodies between preferred embodiments of the present invention and the second comparative example.

FIG. 12 illustrates the magnitude of vibration at the front end of a piezoelectric body. The magnitude of vibration was obtained by measuring the amplitude of an end portion of the piezoelectric body near the bent portion. In the second comparative example, compared with the non-limiting example of a preferred embodiment of the present invention, the vibration of the piezoelectric body is larger since the support block vibrates considerably. In the experiment, the magnitude of the vibration in the second comparative example was more than or equal to four times that in the non-limiting example of a preferred embodiment of the present invention. As the vibration of the piezoelectric body increases, the loads on the piezoelectric body and the support member supporting the piezoelectric body also increase. In the second comparative example, the reliability of the bent portion is increased by the support block, but the piezoelectric fan is likely to break since the loads on the piezoelectric body and support member are increased. On the other hand, in the non-limiting example of a preferred embodiment of the present invention, since the vibration of the piezoelectric body is less than or equal to a quarter of that of the second comparative example, the load on the piezoelectric body and support member is small and durability is increased.

As described above, it can be seen that the non-limiting example of a preferred embodiment of the present invention is superior to the second comparative example in terms of cooling capacity and durability.

Although a bimorph piezoelectric fan in which piezoelectric elements are attached on both surfaces of a vibration plate has been described, a unimorph piezoelectric fan in which a piezoelectric element is attached on a single surface of a vibration plate can also be realized. Further, the piezoelectric element attached on a single surface of a vibration plate is not limited to a single element, and may include a plurality of divided piezoelectric elements arranged in the width direction of the vibration plate. However, the piezoelectric elements should preferably be arranged such that the individual blades have approximately uniform amplitudes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric fan comprising:
   a vibration plate one end of which in a length direction is supported in a fixed manner and the other end of which in the length direction is a free end; and
   a piezoelectric element attached on at least one of front and back surfaces of the vibration plate; wherein
   an air stream is generated by vibration of the vibration plate in a thickness direction thereof when the piezoelectric element is driven;
   a right-angle bent portion is provided in an intermediate portion of the vibration plate in the length direction thereof;
   a plurality of divided blades are defined by slits in an area of the vibration plate extending from the free end towards the bent portion and ending before reaching the bent portion, wherein the plurality of divided blades extend in a same direction from a position located between the bent portion and the free end toward the free end; and
   the piezoelectric element is attached on the portion of the vibration plate between the fixed end and the bent portion, and the piezoelectric element is spaced away from the bent portion.

2. The piezoelectric fan according to claim 1, wherein the bent portion includes a round surface.

3. The piezoelectric fan according to claim 1, wherein an extension portion to which a piezoelectric element is not attached is provided at the one end of the vibration plate in the length direction, and the extension portion is supported in a fixed manner by a support member.

4. The piezoelectric fan according to claim 1, further comprising:
   a driver circuit that keeps the blades in a resonant state by sweeping a frequency of a signal supplied to the piezoelectric element over a range, automatically detecting a resonant frequency of the blades based on a change in impedance during the sweeping, and driving the piezoelectric element at the resonant frequency.

5. An air cooling apparatus comprising the piezoelectric fan according to claim 1 and a heat sink including a plurality of heat dissipation fins arranged side by side with spaces therebetween, wherein the plurality of the blades of the piezoelectric fan are inserted between the heat dissipation fins such that an excitation direction of the blades is parallel or substantially parallel with side surfaces of the heat dissipation fins.

6. The air cooling apparatus according to claim 5, wherein the plurality of the blades of the piezoelectric fan are inserted in a direction perpendicular or substantially perpendicular to a bottom surface of the heat sink, and the piezoelectric element is arranged in parallel or substantially in parallel with top surfaces of the fins of the heat sink.

* * * * *